(12) United States Patent
Choi et al.

(10) Patent No.: US 8,040,714 B2
(45) Date of Patent: Oct. 18, 2011

(54) MULTILEVEL NONVOLATILE MEMORY DEVICE USING VARIABLE RESISTANCE

(75) Inventors: Byung-Gil Choi, Yongin-si (KR); Du-Eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 276 days.

(21) Appl. No.: 12/423,881

(22) Filed: Apr. 15, 2009

(65) Prior Publication Data
US 2009/0262573 A1    Oct. 22, 2009

(30) Foreign Application Priority Data
Apr. 16, 2008    (KR) .................. 10-2008-0035242

(51) Int. Cl.
*G11C 11/00* (2006.01)
(52) U.S. Cl. ... 365/148; 365/100; 365/158; 365/189.09; 365/189.15
(58) Field of Classification Search .................. 365/148, 365/163, 185.18, 185.03, 189.09, 189.011, 365/100, 158, 189.15
See application file for complete search history.

(56) References Cited

U.S. PATENT DOCUMENTS

| | | | | |
|---|---|---|---|---|
| 6,552,927 B2* | 4/2003 | Naji | ........................... | 365/158 |
| 6,611,455 B2* | 8/2003 | Sekiguchi et al. | ........... | 365/171 |
| 7,848,138 B2* | 12/2010 | Bedeschi et al. | ............ | 365/163 |
| 2007/0201267 A1* | 8/2007 | Happ et al. | .................... | 365/163 |
| 2008/0232171 A1* | 9/2008 | Bedeschi et al. | ........ | 365/185.22 |

* cited by examiner

*Primary Examiner* — Pho M Luu
*Assistant Examiner* — Thao Bui
(74) *Attorney, Agent, or Firm* — Volentine & Whitt, PLLC

(57) ABSTRACT

A multilevel nonvolatile memory device using a resistance material is provided. The multilevel nonvolatile memory device includes at least one multilevel memory cell and a read circuit. The at least one multilevel memory cell has a level of resistance that varies according to data stored therein. The read circuit first reads first bit data from the multilevel memory cell by providing a first read bias to the multilevel memory cell and secondarily reads second bit data from the multilevel memory cell by providing a second read bias to the multilevel memory cell. The second read bias varies according to a result of the first reading.

13 Claims, 6 Drawing Sheets

MULTILEVEL NONVOLATILE MEMORY DEVICE USING VARIABLE RESISTANCE

PRIORITY STATEMENT

A claim of priority is made to Korean Patent Application No. 10-2008-0035242 filed on Apr. 16, 2008, in the Korean Intellectual Property Office, the subject matter of which is hereby incorporated by reference.

SUMMARY

Embodiments of the present invention relate to a multilevel nonvolatile memory device and a driving method thereof.

Nonvolatile memory devices using resistance materials include phase-change random access memory (PRAM) devices, resistive random access memory (RRAM) devices, and magnetic random access memory (MRAM) devices. Such nonvolatile memory devices store data using variations in the state of a phase-change material, such as a chalcogenide alloy, using variations in the resistance of a variable-resistance material, or using variations in the resistance of magnetic tunnel junction (MTJ) films caused by variations in magnetic states of a ferroelectric material. In comparison, dynamic random access memory (DRAM) devices or flash memory devices store data using electric charges.

There are various methods for storing large amounts of data using a wafer having a limited size. For example, the number of nonvolatile memory cells formed on the wafer may be increased using sophisticated lithography techniques implemented with special lithography equipment. Also, more than one bit may be stored in one memory cell to increase the storage density of a nonvolatile memory device. Nonvolatile memory devices capable of storing more than one bit in each memory cell are generally referred to as multilevel nonvolatile memory devices. Each memory cell of a multilevel nonvolatile memory device using a resistance material may have three or more resistance levels, according to the level of data stored therein, requiring the data to be accurately read from each memory cell.

Aspects of the present invention provide a multilevel nonvolatile memory device which can improve efficiency and reliability of a read operation. However, the aspects, features and advantages of the present invention are not restricted to those set forth herein, and other aspects, features and advantages will be apparent to one of ordinary skill in the art, referencing the detailed description, below.

According to an aspect of the present invention, there is provided a multilevel nonvolatile memory device that includes at least one multilevel memory cell and a read circuit. The at least one multilevel memory cell has a level of resistance that varies according to data stored therein. The read circuit first reads first bit data from the multilevel memory cell by providing a first read bias to the multilevel memory cell and second reads second bit data from the multilevel memory cell by providing a second read bias to the multilevel memory cell. The second read bias varies according to a result of the first reading.

According to another aspect of the present invention, there is provided a multilevel nonvolatile memory device including at least one multilevel memory cell, a sensing node, a switch, a read-bias providing unit, and a sensor. The at least one multilevel memory cell is coupled to a wordline and a bitline, the at least one multilevel memory cell having a level of resistance that varies according to a value of data stored therein. The sensing node is coupled to the bitline. The switch selects one of multiple driving biases having different levels and sequentially provides first and second control biases. The read-bias providing unit is coupled to the sensing node and provides a first read bias based on the first control bias and a second read bias based on the second control bias. The sensor is coupled to the sensing node and compares a level of the sensing node with a level of a reference bias. The sensor outputs first comparison result data in response to the first read bias and outputs second comparison result data in response to the second read bias. A level of the second control bias is determined according to the first comparison result data.

BRIEF DESCRIPTION OF THE DRAWINGS

The embodiments of the present invention will be described with reference to the attached drawings, in which.

DETAILED DESCRIPTION OF THE EMBODIMENTS

Figure 1:
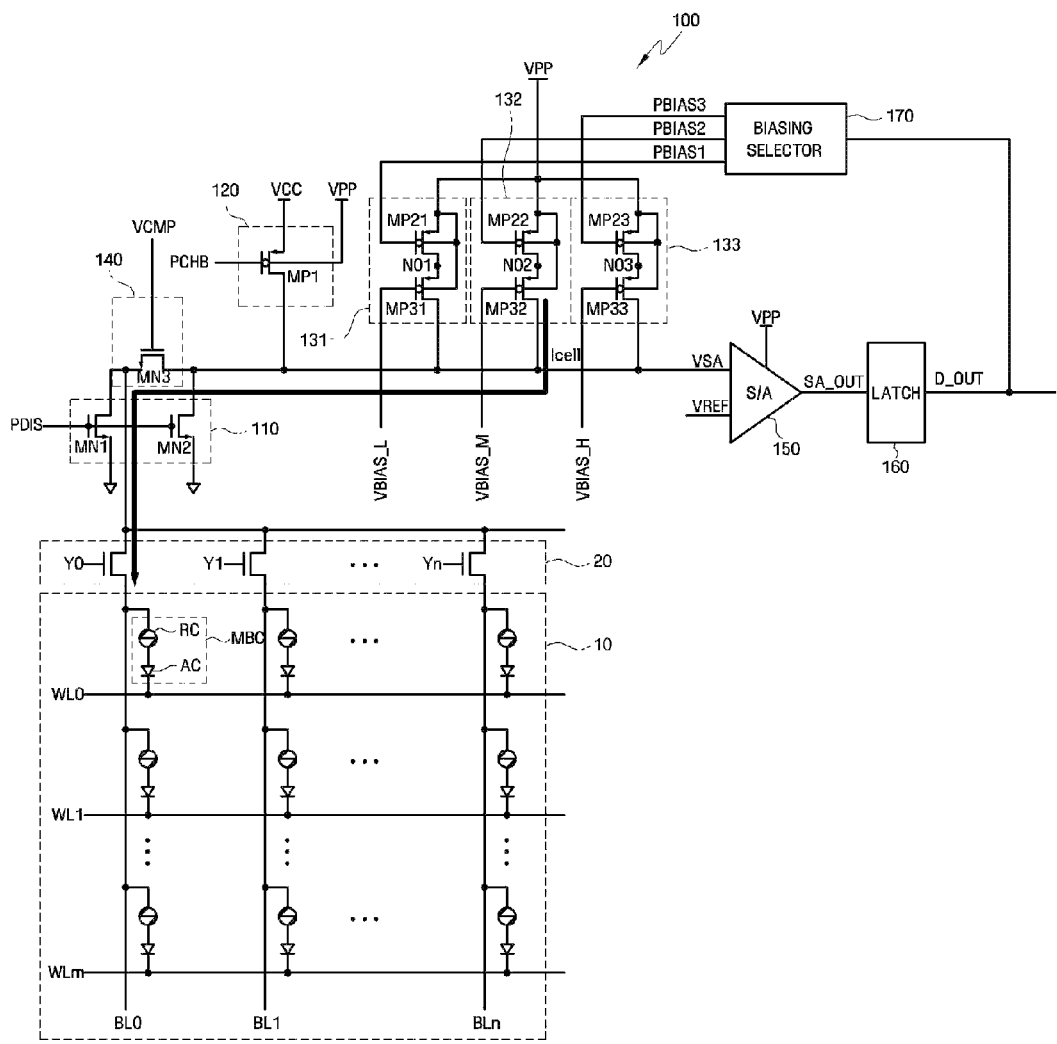
FIG. 1 is a block diagram illustrating a multilevel nonvolatile memory device, according to an embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Throughout the drawings and written description, like reference numerals will be used to refer to like or similar elements. As used herein the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can encompass both an orientation of above and below.

Illustrative embodiments of the present invention will be described in detail, using a phase-change random access memory (PRAM) as an example. However, the present invention is not restricted to this configuration. That is, embodiments of the present invention can also be applied to various types of nonvolatile memory devices using a resistance material, such as a resistive random access memory (RRAM) device or a ferroelectric random access memory (FRAM) device, for example.

For purposes of explanation, it is assumed that multilevel memory cells store 2-bit data. However, embodiments of the present invention are not restricted to this implementation. That is, the multilevel memory cells may alternatively store 3- or 4-bit data, for example.

FIG. 1 is a block diagram illustrating a multilevel nonvolatile memory device, according to an illustrative embodiment of the present invention. Referring to FIG. 1, the multilevel nonvolatile memory device includes a memory cell array 10, a column selection circuit 20, a row selection circuit (not shown) and a read circuit 100.

The memory cell array 10 includes multiple multilevel memory cells MLC, which are arranged in a matrix. The multilevel memory cells MLC are coupled between wordlines WL0 through WLm and bitlines BL0 through BLn. Each of the multilevel memory cells MLC includes a variable resistance circuit RC and an access circuit AC. The variable resistance circuit RC includes a phase-change material, which may have three or more resistance levels, for example, according to a level of data stored in the corresponding MLC. The access circuit AC controls a current that flows in the variable resistance circuit RC. For example, a variable resistance circuit RC of an MLC capable of storing 2-bit data may have four resistance levels respectively corresponding to data values of 00, 01, 10 and 11. The resistance level corresponding to the data value of 00 may be lowest, the resistance level corresponding to the data value of 11 may be highest, and the resistance level corresponding to the data value of 10 may be higher than the resistance level corresponding to the data value of 01. The variable resistance circuits RC may be diodes, and the access circuits AC may be diodes or transistors coupled in series to the respective variable resistance circuits RC, for example. The phase-change material of the variable resistance circuits RC may be a binary compound, such as GaSb, InSb, InSe, $Sb_2Te_3$ or GeTe; a ternary compound such as GeSbTe, GaSeTe, InSbTe, $SnSb_2Te_4$, or InSbGe; or a quaternary compound such as AgInSbTe, (GeSn)SbTe, GeSb(SeTe), or $Te_{81}Ge_{15}Sb_2S_2$. In an embodiment, it is assumed the phase-change material of the variable resistance circuits RC is GeSbTe.

The row selection circuit selects one of the wordlines WL0 through WLm (e.g., WL0), and the column selection circuit 20 selects one of the bitlines BL0 through BLn (e.g., BL0).

The read circuit 100 reads data from the multilevel memory cells MLC in the memory cell array 10. The read circuit 100 may initially read first bit data (e.g., most significant bit (MSB) data) from the multilevel memory cells MLC by providing a first read bias (Icell) to the multilevel memory cells MLC. Then, the read circuit 100 may subsequently read second bit data (e.g., least significant bit (LSB) data) from the multilevel memory cells MLC by providing a second read bias (Icell) to the multilevel memory cells MLC.

The second read bias may vary according to the result of the initial read operation performed by the read circuit 100. More specifically, when the first bit data has a first level, the read circuit 100 may provide the multilevel memory cells MLC a second read bias, having a level higher than a level of the first read bias, to read the second bit data from the multilevel memory cells MLC. On the other hand, when the first bit data has a second level, the read circuit 100 may the multilevel memory cells MLC a second read bias, having a level lower than the level of the first read bias, to read the second bit data from the multilevel memory cells MLC.

Referring to FIG. 1, the read circuit 100 may include a discharge unit 110, a precharge unit 120, a read-biasing selector 170, multiple read-bias providing units 131 through 133, a clamping unit 140, a sensing unit 150 and a latch unit 160.

The discharge unit 110 discharges a multilevel memory cell MLC, which has been chosen in advance (hereinafter referred to as the chosen multilevel memory cell MLC), and sensing node VSA and/or bitline (e.g., BL0) coupled to the chosen multilevel memory cell MLC to a ground voltage, for example. The discharge unit 110 may include NMOS transistor MN1, which is coupled between the bitline BL0 and a ground voltage source VSS and has a gate to which a discharge signal PDIS is applied, and NMOS transistor MN2, which is coupled between the sensing node VSA and the ground voltage source VSS and has a gate to which the discharge signal PDIS is applied.

During a precharge period of a read operation, the precharge unit 120 precharges the sensing node VSA to a power supply voltage, for example. The precharge unit 120 may include a PMOS transistor MP1, which is coupled between power source VCC and the sensing node VSA and has a gate to which a precharge signal PCHB is applied.

The read-biasing selector 170 provides biasing signals PBIASB1 through PBIASB3, which selectively enable the read-bias providing units 131 through 133, respectively. More specifically, the read-biasing selector 170 may generate the biasing signals PBIASB1 through PBIAS3 based on a biasing selection signal (not shown) and/or bit data Dout, which is obtained by a first read operation performed by the read circuit 100. The read-biasing selector 170 is illustrated in FIG. 1 as generating the biasing signals PBIASB1 through PBIAS3 based on the bit data Dout, but the various embodiments of the present invention are not restricted to configuration. That is, the read-biasing selector 170 may generate the biasing signals PBIASB1 through PBIAS3 based on comparison result data SA_OUT, for example. The read-biasing selector 170 will be described in further detail with reference to FIG. 4.

In order to read the resistance of the chosen multilevel memory cell MLC, the read-bias providing units 131 through 133 may sequentially provide first and second read biases to the sensing node VSA using multiple driving biases VBIAS_L, VBIAS_M, and VBIAS_H. More specifically, the read-bias providing units 131 through 133 may be selectively enabled by the biasing signals PBIASB1 through PBIASB3, and may thus sequentially provide the first and second read biases, which have different levels, using one of the driving biases VBIAS_L, VBIAS_M, and VBIAS_H. The process of reading the resistance of a multilevel memory cell MLC using the first and second read biases will be described in detail with reference to FIGS. 2 and 3.

The read-bias providing unit 131 may include PMOS transistor MP21, which is coupled between a boosted voltage source VPP and node N01 and has a gate to which the biasing signal PBIASB1 is applied, and PMOS transistor MP31, which is coupled between the node N01 and the sensing node VSA and has a gate to which the driving bias VBIAS_L is applied. The read-bias providing unit 132 may include PMOS transistor MP22, which is coupled between the boosted voltage source VPP and node N02 and has a gate to which the biasing signal PBIASB2 is applied, and PMOS transistor MP32, which is coupled between the node N02 and the sensing node VSA and has a gate to which the driving bias VBIAS_M is applied. The read-bias providing unit 133 may include a PMOS transistor MP23, which is coupled between the boosted voltage source VPP and node N01 and has a gate to which the biasing signal PBIASB3 is applied, and PMOS transistor MP33, which is coupled between the node N03 and the sensing node VSA and has a gate to which the driving bias VBIAS_H is applied. In an embodiment, a region on a substrate where the PMOS transistors MP21 through MP23 and MP31 through MP33 are mounted may be coupled to the boosted voltage source VPP.

The clamping unit 140 clamps the bitline BL0 to a bias within a predetermined range that is suitable for a read operation. More specifically, the clamping unit 140 may clamp the bitline BL0 to a bias having a level lower than a threshold voltage Vth of the phase-change material of the chosen multilevel memory cell MLC considering that a bias having a level higher than the threshold voltage Vth may be able to change the phase of the phase-change material of the chosen multilevel memory cell MLC. The clamping unit 140 may include NMOS transistor MN3, for example, coupled between the bitline BL0 and the sensing node VSA and having a gate to which a clamping control signal VCMP is applied. The clamping control signal VCMP may be a static voltage signal, although various embodiments of the present invention are not restricted to this.

The sensing unit 150 compares a level of the sensing node VSA with a level of a reference bias VREF and outputs the comparison result data SA_OUT as a result of the comparison. For example, when the level of the sensing node VSA is higher than the level of the reference bias VREF, the sensing unit 150 may output comparison result data SA_OUT having a high level. On the other hand, when the level of the sensing node VSA is lower than the level of the reference bias VREF, the sensing unit 150 may output comparison result data SA_OUT having a low level. In various embodiments, the sensing unit 150 may be a current sense amplifier which detects a variation in a reference current flowing out of the chosen multilevel memory cell MLC through the bitline BL0, or a voltage sense amplifier, which detects a variation in a reference voltage. The sensing unit 150 is illustrated in FIG. 1 as being a voltage sense amplifier, as an example. The level of the reference bias VREF does not vary regardless of whether the level of a read bias varies.

The latch unit 160 alters data stored therein, i.e., the bit data DOUT, according to the comparison result data SA_OUT provided by the sensing unit 150. More specifically, the sensing unit 150 outputs the comparison result data SA_OUT when the first and second read biases are provided to the chosen multilevel memory cell MLC, respectively. The latch unit 160 may alter the previously latched bit data DOUT according to the comparison result data SA_OUT output by the sensing unit 150, and output the altered bit data DOUT.

A read operation performed by the multilevel nonvolatile memory device illustrated in FIG. 1 will hereinafter be described in detail with reference to FIGS. 1 through 3.

Figure 2:
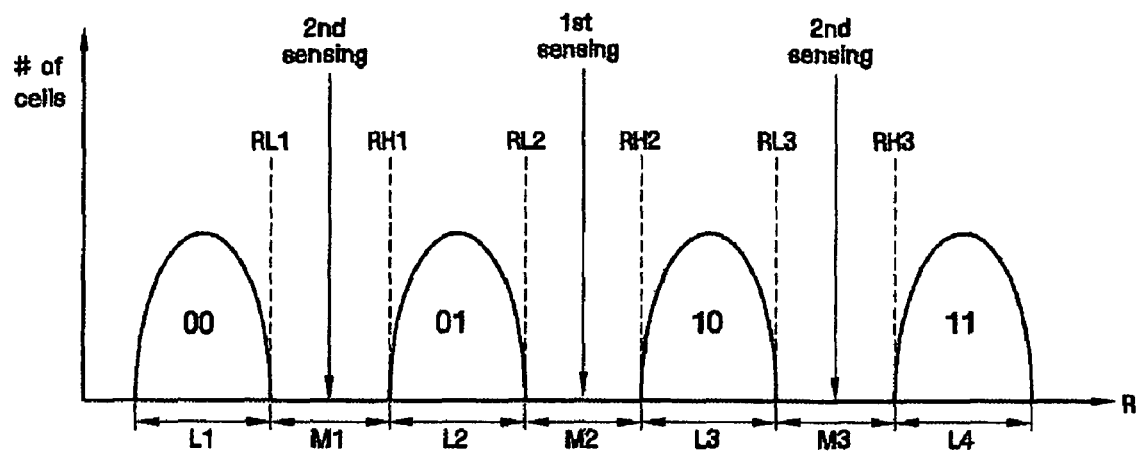
FIG. 2 is a graph illustrating a plurality of resistance levels of each multilevel memory cell of the multilevel nonvolatile memory device shown in FIG. 1, according to an embodiment of the present invention.

FIG. 2 is a graph illustrating multiple resistance levels of each multilevel memory cell of the multilevel nonvolatile memory device shown in FIG. 1, according to an illustrative embodiment of the present invention. FIG. 3 is a graph illustrating read biases used in the multilevel nonvolatile memory device shown in FIG. 1, according to an illustrative embodiment of the present invention. More specifically, FIG. 3 illustrates two read biases that are provided during one read cycle according to the result of an initial read operation performed by the read circuit 100.

Referring to FIG. 2, an X axis represents resistance (R), and a Y axis represents the number of memory cells. Nonvolatile memory cells may store one of multiple data values 00, 01, 10 and 11, respectively corresponding to first, second, third and fourth resistance level L1, L2, L3 and L4. The first resistance level L1 is lowest, the fourth resistance level L4 is highest, and the second resistance level L2 is lower than the third resistance level L3.

The first resistance level L1 is lower than first reference resistance level RL1, and the second resistance level L2 is higher than second reference resistance level RH1 and lower than third reference resistance level RL2. Further, the third resistance level L3 is higher than fourth reference resistance level RH2 and lower than fifth reference resistance level RL3, and the fourth resistance level L4 is higher than sixth reference resistance level RH3. A first resistance margin M1 is provided between the first and second resistance levels L1 and L2, a second resistance margin M2 is provided between the second and third resistance levels L2 and L3, and a third resistance margin M3 is provided between the third and fourth resistance levels L3 and L4.

Figure 3:
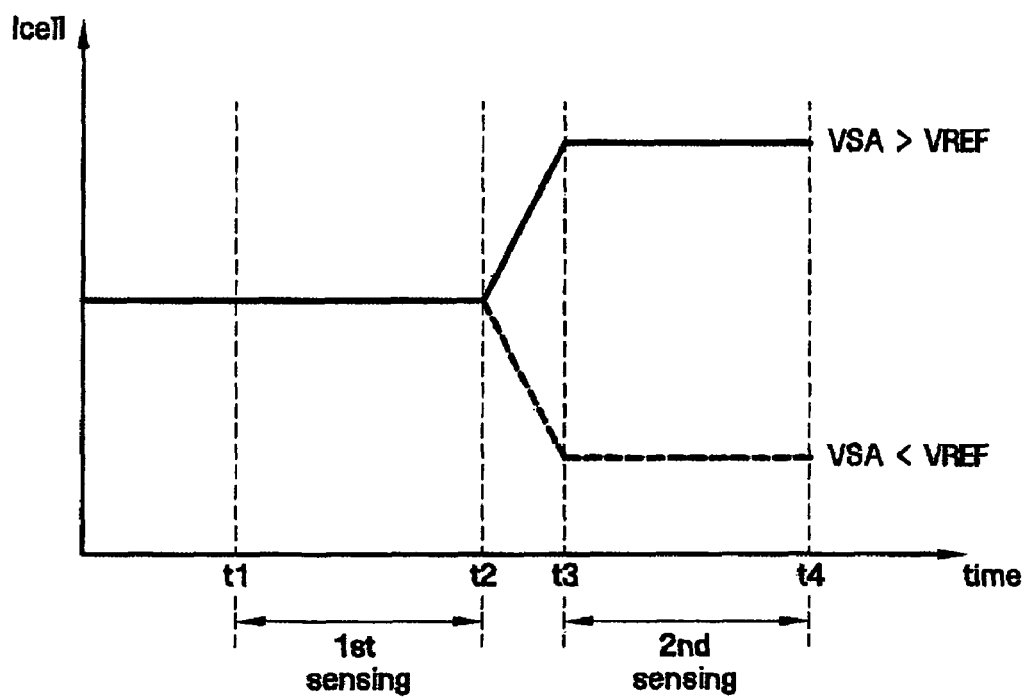
FIG. 3 is a graph illustrating read biases used in the multilevel nonvolatile memory device shown in FIG. 1, according to an embodiment of the present invention.

Referring to FIGS. 1 through 3, the read-bias providing unit 132 provides a first read bias to the chosen multilevel memory cell MLC using the driving bias VBIAS_M. Then, the sensing unit 150 outputs comparison result SA_OUT. The first read bias corresponds to a resistance level within the resistance margin M2.

When the first read bias is provided to the chosen multilevel memory cell MLC, it is possible to determine whether first bit data (e.g., an MSB) present in the chosen multilevel memory cell MLC is 0 or 1. Therefore, it is possible to determine that the chosen multilevel memory cell MLC stores either a data value of 00 or 01 or a data value of 10 or 11.

Then, one of the read-bias providing unit 131 or the read-bias providing unit 133 provides a second read bias to the chosen multilevel memory cell MLC using the driving bias VBIAS_L or VBIAS_H, respectively. The sensing unit 150 may then output comparison result SA_OUT. The second read bias may correspond to a resistance level within the resistance margin M1 or M3.

More specifically, when the first bit data is 1, e.g., indicated by the level of the sensing node VSA being higher than the level of the reference bias VREF, the second read bias may correspond to a resistance level within the resistance margin M3. Therefore, it is possible to determine whether the second bit data is 0 or 1, thereby determining whether the chosen multilevel memory cell MLC stores a data value of 10 or 11, by providing a second read bias having a level higher than that of the first read bias to the chosen multilevel memory cell MLC using the driving bias VBIAS_H.

On the other hand, when the first bit data is 0, e.g., indicated by the level of the sensing node VSA being lower than the level of the reference bias VREF, the second read bias may correspond to a resistance level within the resistance margin M1. Therefore, it is possible to determine whether the second bit data is 0 or 1, thereby determining whether the chosen multilevel memory cell MLC stores a data value of 00 or 01, by providing a second read bias having a level lower than the level of the first read bias to the chosen multilevel memory cell MLC using the driving bias VBIAS_L.

Referring to FIG. 3, assuming a read cycle occurs over a time period from t1 to t4, the first sensing operation is performed during the time period between t1 and t2 by providing the first read bias to the chosen multilevel memory cell MLC using the driving bias VBIAS_M, and the second sensing operation is performed during the time period between t3 and t4 by providing the second read bias to the chosen multilevel memory cell MLC using one of the driving biases VBIAS_L and VBIAS_H, according to the result of the first sensing operation. The time period between t2 and t3 is a set-up period for the second sensing operation.

Figure 4:
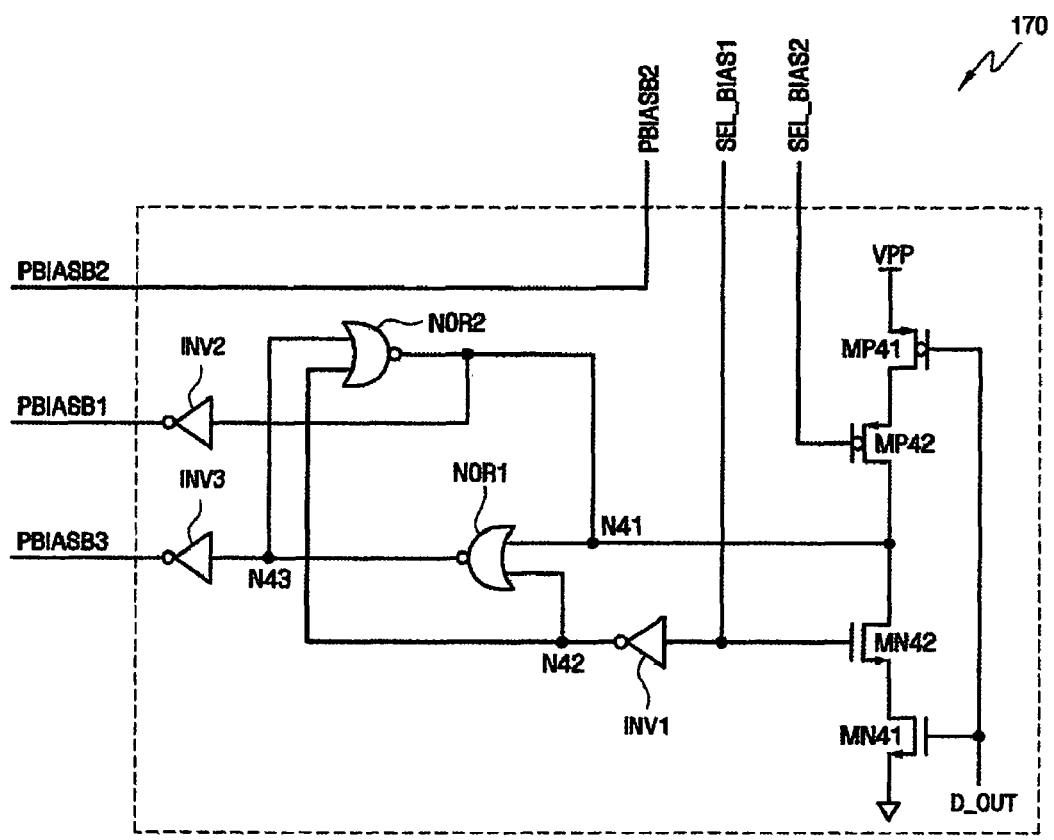
FIG. 4 is a circuit diagram illustrating a read-biasing selector shown in FIG. 1, according to an embodiment of the resent invention.
Figure 5:
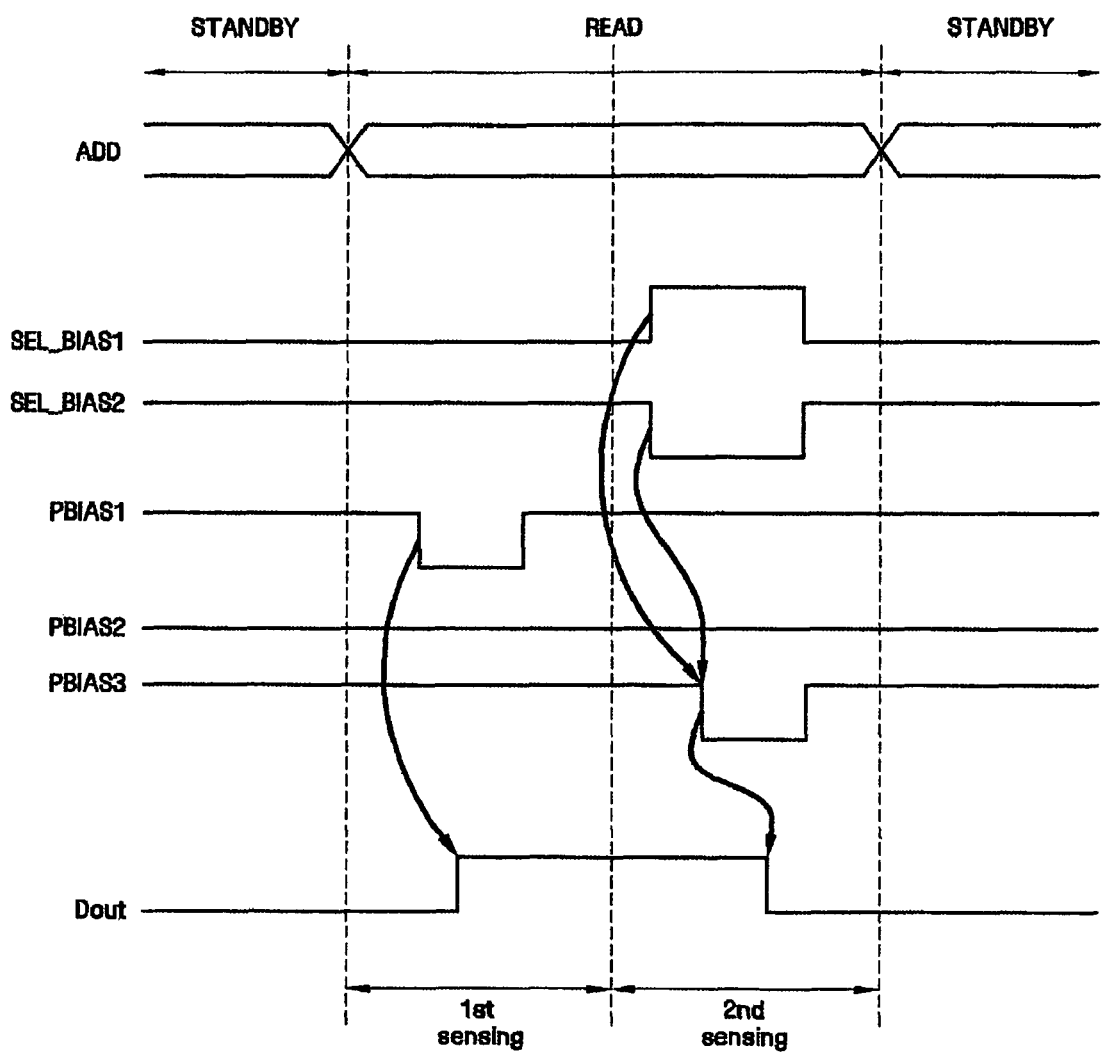
FIG. 5 is a timing diagram illustrating operation of the read-biasing selector shown in FIG. 4, according to an embodiment of the present invention.

FIG. 4 is a circuit diagram illustrating a read-biasing selector 170 shown in FIG. 1, according to an illustrative embodiment of the present invention. FIG. 5 is a timing diagram illustrating operation of the read-biasing selector 170 shown in FIG. 4, according to an embodiment of the present invention.

Referring to FIG. 4, the read-biasing selector 170 may include multiple transistors, including first and second PMOS transistors MP41 and MP42 and first and second NMOS transistors MN41 and MN42. The read-biasing selector 170 may also include multiple logic elements, including first through third inverters INV1 through INV3 and first and second NOR gates NOR1 and NOR2.

The first and second PMOS transistors MP41 and MP42 are coupled in series between the boosted voltage source VPP and node N41. The bit data Dout may be applied to the gate of the first PMOS transistor MP41, and a second biasing selection signal SEL_BIAS2 may be applied to the gate of the second PMOS transistor MP42. The first and second NMOS transistors MN41 and MN42 are coupled in series between the node N41 and a low voltage such as ground VSS. The bit data Dout may be applied to the gate of the first NMOS transistor MN41, and a first biasing selection signal SEL_BIAS1 may be applied to the gate of the second NMOS transistor MN42. The gate of the second NMOS transistor MN42 may be coupled to the first NOR gate NOR1 through the first inverter element INV1, as well.

The first NOR gate NOR1 is coupled among the node N41 (which is the output node of the second NOR gate NOR2), node N42 (which is the output node of the first inverter INV1), and node N43 (which is an input node of the second NOR gate NOR2 and provides the biasing signal PBIASB3 through the third inverter INV3). The second NOR gate NOR2 is coupled among the node N43 (which is the output node of the first NOR gate NOR1), the node N42 (which is the output node of the first inverter INV1), and the node N41 (which is an input node of the first NOR gate NOR1 and provides the biasing signal PBIASB1 through the second inverter INV2).

The operation of the read-biasing selector 170 will hereinafter be described in detail with reference to FIG. 4.

The multilevel nonvolatile memory device may initiate a read operation in response to a read command. The read command may be the combination of at least one command signal and at least one address signal ADD, although only the address signal ADD is illustrated in FIG. 5 as the read command.

The read-biasing selector 170 provides the biasing signal PBIASB2 to the read-bias providing unit 132, and the sensing unit 150 performs a first sensing operation. Thereafter, the read-biasing selector 170 provides either the biasing signal PBIASB1 or the biasing signal PBIASB3 to the read-bias providing units 131 or 133, respectively, according to the result of the first sensing operation, i.e., the bit data Dout, and the sensing unit 150 performs a second sensing operation.

The levels of the bit data Dout, the first and second biasing selection signals SEL_BIAS1 and SEL_BIAS2, the biasing signals PBIASB1 through PBIASB3, and the levels of the nodes N41 through N43 are as shown in Table 1 below.

TABLE 1

| Dout | SEL_BIAS1 | SEL_BIAS2 | N41 | N42 | N43 | PBIASB1 | PBIASB2 | PBIASB3 |
|---|---|---|---|---|---|---|---|---|
| H | H | L | L | L | H | H | H | L |
| L | H | L | H | L | L | L | H | H |

For example, during the first sensing operation, when the bit data Dout has a high level, the first biasing selection signal SEL_BIAS1 has a high level and the second biasing election signal SEL_BIAS2 has a low level, and the first and second NMOS transistors MN41 and MN42 are switched on. The level of the node N41 therefore becomes low. Since the first biasing selection signal SEL_BIAS1 has a high level, the level of the output node of the first inverter INV1, i.e., the level of the node N42, becomes low.

Since the two input nodes of the first NOR gate NOR1, i.e., the nodes N41 and N42, are both provided with low-level signals, the level of the output node of the first NOR gate NOR1, i.e., the level of the node N43, becomes high. Also, since the two input nodes of the second NOR gate NOR2, i.e., the nodes N42 and N43, are provided with signals having different levels, the level of the output node of the second NOR gate NOR2, i.e., the level of the node N41, is low. Therefore, the read-biasing selector 170 provides biasing signal PBIASB1 having a high level, based on the low-level signal at node N41 passing through second inverter element INV2, and provides biasing signal PBIASB3 having a low level, based on the high-level signal at node N43 passing through third inverter element INV3. The read-bias providing unit 133 therefore provides the second read bias in response to PBIASB3 using the driving bias VBIAS_H.

Conversely, when the bit data Dout has a low level, the first biasing selection signal SEL_BIAS1 has a high level and the second biasing election signal SEL_BIAS2 has a low level, and the first and second PMOS transistors MP41 and MP42 are switched on. The level of the node N41 therefore becomes high. Since the first biasing selection signal SEL_BIAS1 has a high level, the level of the output node of the first inverter INV1, i.e., the level of the node N42, becomes low.

Since the two input nodes of the first NOR gate NOR1, i.e., the nodes N41 and N42, are provided with signals having different levels, the level of the output node of the first NOR gate NOR1, i.e., the level of the node N43, becomes low. Also, since the two input nodes of the second NOR gate NOR2, i.e., the nodes N42 and N43, are both provided with signals having low levels, the level of the output node of the second NOR gate NOR2, i.e., the level of the node N41, is high. Therefore, the read-biasing selector 170 provides biasing signal PBIASB1 having a low level, based on the high-level signal at node N41 passing through second inverter element INV2, and biasing signal PBIASB3 having a high level, based on the low-level signal at node N43 passing through third inverter element INV3. The read-bias providing unit 131 therefore provides the second read bias in response to PBIASB1 using the driving bias VBIAS_L.

The multilevel nonvolatile memory device of the embodiment of FIG. 1 reads 2-bit data from each of the multilevel memory cells MLC by performing two sensing operations. It is therefore possible to reduce the time taken to perform a read operation, compared to parallel sensing, in which three sensing operations are respectively performed by three sensing units.

A multilevel nonvolatile memory device according to another embodiment of the present invention will hereinafter be described in detail with reference to FIGS. 2 through 7.

Figure 6:
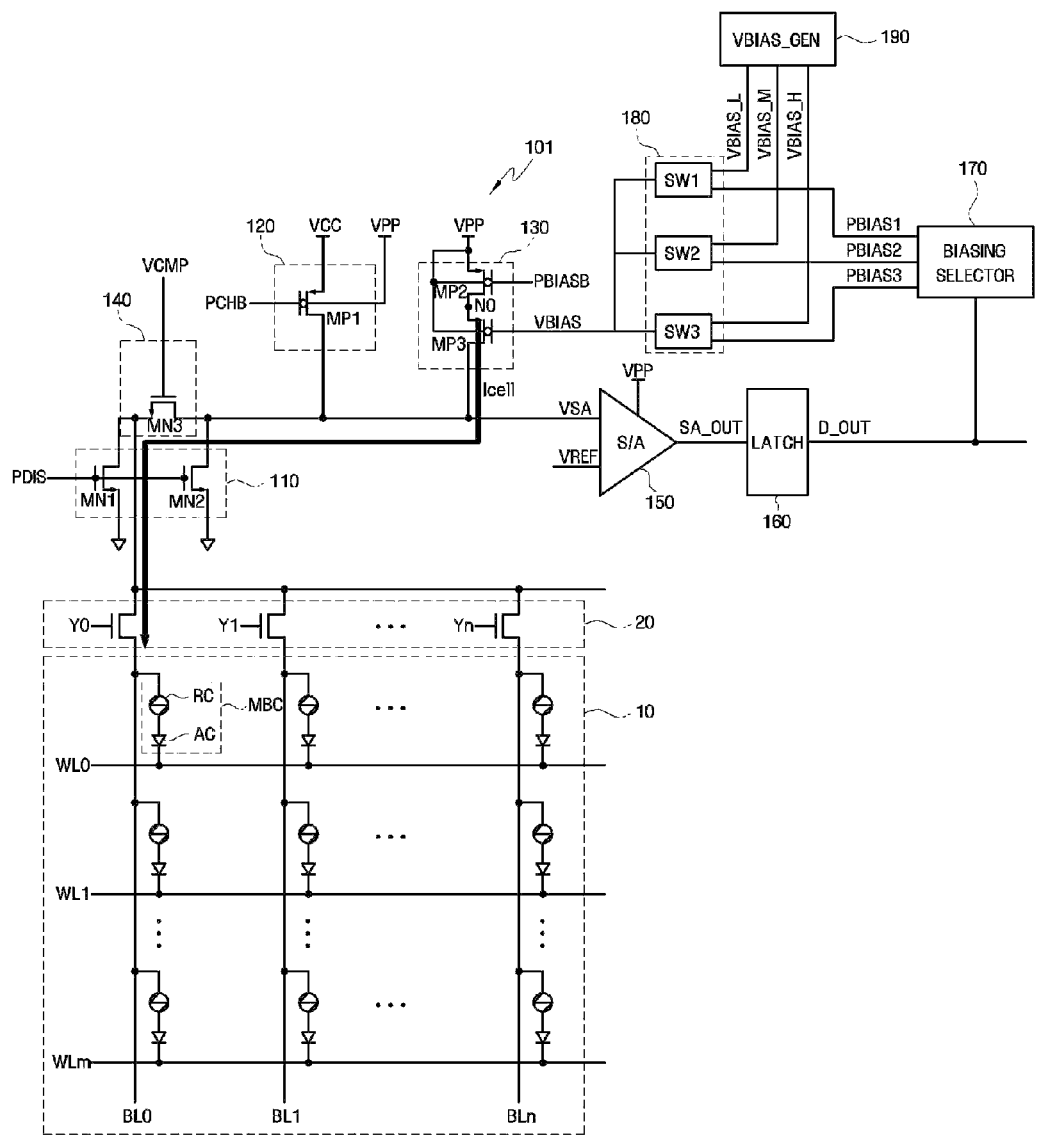
FIG. 6 is a block diagram illustrating a multilevel nonvolatile memory device, according to an embodiment of the present invention.
Figure 7:
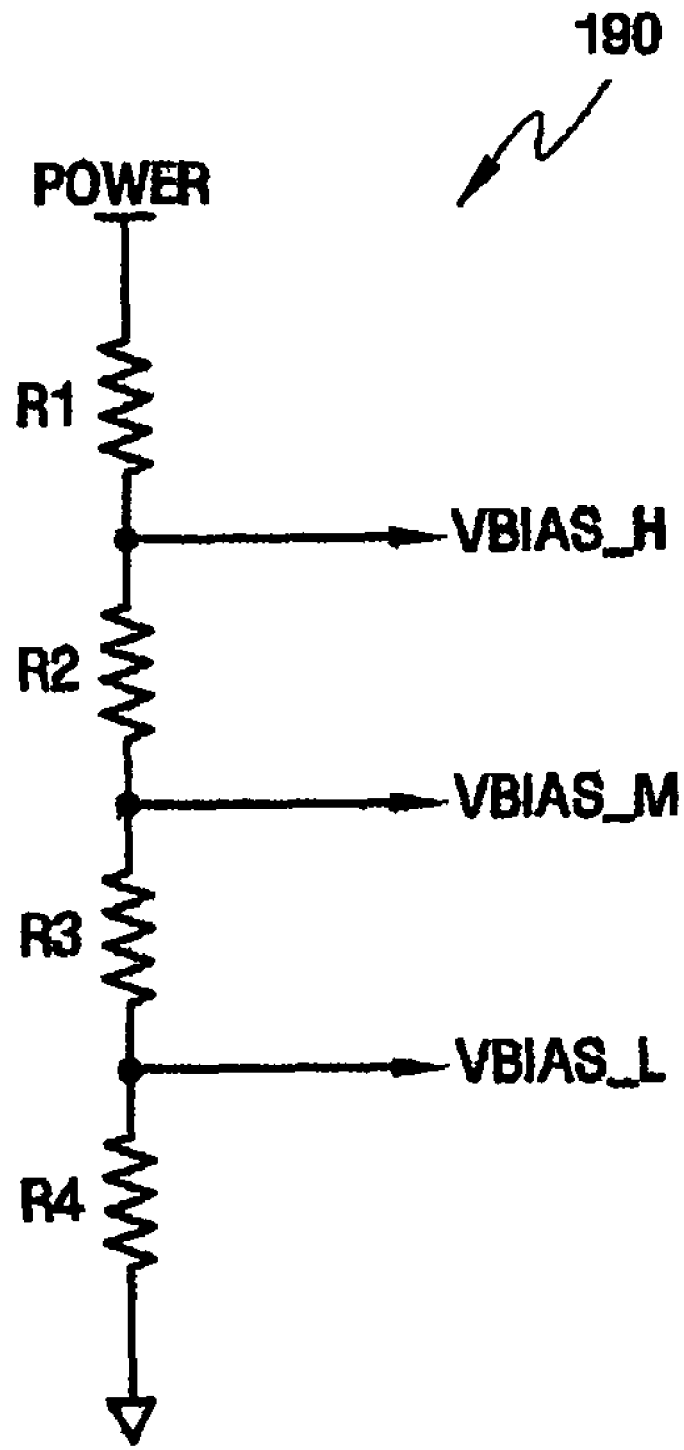
FIG. 7 is a circuit diagram illustrating a driving-bias generation unit shown in FIG. 6, according to an embodiment of the present invention.

FIG. 6 illustrates a block diagram of a multilevel nonvolatile memory device according to another illustrative embodiment of the present invention, and FIG. 7 illustrates a circuit diagram of a driving-bias generation unit 190 shown in FIG. 6.

Referring to FIGS. 6 and 7, the multilevel nonvolatile memory device includes a read circuit 101. The read circuit 101 include only one read-bias providing unit 130, as compared to the read circuit 100 illustrated in FIG. 1, which includes three read-bias providing units 131 through 133. The read circuit 101 also includes a switching unit 180, which selects one of multiple driving biases VBIAS_L, VBIAS_M and VBIAS_H provided by the driving-bias generation unit 190 according to the result of a first read operation, and provides the selected driving bias to the read-bias providing unit 130.

More specifically, the read circuit 101 may include a discharge unit 110, a precharge unit 120, a control read-biasing selector 171, a switching unit 180, the read-bias providing unit 130, a clamping unit 140, a sensing unit 150, and a latch unit 160.

The control-biasing selector 171 provides multiple biasing signals PBIASB1 through PBIASB3, which selectively enable the switching unit 180. The control-biasing selector 171 may be substantially the same as the read-biasing selector 170 illustrated in FIG. 1, for example, except that the biasing signals PBIASB1 through PBIASB3 are provided to the switching unit 180 as opposed to read-bias providing units 131 through 133. The control-biasing selector 171 may provide the biasing signals PBIASB1 through PBIASB3 to the switching unit 180 using a biasing selection signal (not shown) and/or bit data Dout, which results from a primary read operation performed by the read circuit 101.

The switching unit 180 may include multiple switches SW1 through SW3. The switching unit 180 selects one of the driving biases VBIAS_L1, VBIAS_M, and VBIAS_H, which have different levels, in response to the biasing signals PBIASB1 through PBIASB3 selected by the control-biasing selector 171. The selected driving bias is provided to the read-bias providing unit 130.

More specifically, the switching unit 180 provides the driving bias VBIAS_M to the read-bias providing unit 130 as control bias VBIAS in response to the biasing signal PBIASB2 having a low level. Then, the read circuit 101 provides a first read bias to a chosen multilevel memory cell MLC using the control bias VBIAS, and thus the sensing unit 150 may perform a first sensing operation, thereby reading first bit data (e.g., an MSB) from the chosen multilevel memory cell MLC.

Thereafter, the switching unit 180 selects one of the driving biases VBIAS_L, VBIAS_M and VBIAS_H according the level of the first bit data and provides the selected driving bias as the control bias VBIAS.

More specifically, when the first bit data is 1, i.e., when the level of a sensing node VSA is higher than the level of a reference bias VREF, the switching unit 180 provides the driving bias VBIAS_H to the read-bias providing unit 130 as the control bias VBIAS in response to the biasing signal PBIASB3 having a low level. On the other hand, when the first bit data is 0, i.e., when the level of the sensing node VSA is lower than the level of the reference bias VREF, the switching unit 180 provides the driving bias VBIAS_L to the read-bias providing unit 130 as the control bias VBIAS in response to the biasing signal PBIASB1 having a low level.

In this manner, the read circuit 101 may provide a second read bias to the chosen multilevel memory cell MLC using the control bias. The sensing unit 150 may therefore perform a second sensing operation to read second bit data (e.g., an LSB) from the chosen multilevel memory cell MLC.

The driving biases VBIAS_L, VBIAS_M, and VBIAS_H may be provided by the driving-bias generation unit 190. For example, the driving biases VBIAS_H, VBIAS_M, and VBIAS_L may be 2 V, 1.5 V, and 1 V, respectively. Referring to FIG. 7, the depicted illustrative configuration of the driving-bias generation unit 190 includes multiple resistors R1 through R4, which are connected in series to one another. The driving biases VBIAS_L, VBIAS_M, and VBIAS_H are then generated using a voltage division method.

The multilevel nonvolatile memory device of the illustrative embodiment shown in FIG. 1 reads 2-bit data from each multilevel memory cell by performing two sensing operations and can thus reduce the time taken to perform a read operation, e.g., compared to parallel sensing.

In the multilevel nonvolatile memory device of the illustrative embodiment shown in FIGS. 6 and 7, the driving-bias generation unit 190 generates the driving biases VBIAS_L, VBIAS_M, and VBIAS_H in advance, and the switching unit 180 selectively provides one of the driving biases VBIAS_L, VBIAS_M, and VBIAS_H as the control bias VBIAS. Therefore, it is possible to quickly provide the control bias VBIAS, as compared to forming multiple driving biases after initiating a read operation and forming a control bias using the driving bias. Therefore, it is possible to reduce the time required to perform the read operation.

In order to read the resistance of the chosen multilevel memory cell MLC, the read-bias providing unit 130 of FIG. 6 may sequentially provide first and second read biases (Icell) to the sensing node VSA in response to the control bias VBIAS. The read-bias providing unit 130 may include a PMOS transistor MP2, for example, which is coupled between a boosted voltage source VPP and a node N0, and has a gate to which a biasing signal PBIASB is applied. The read-bias providing unit 130 may also include a PMOS transistor MP3, for example, which is coupled between the node N0 and the sensing node VSA, and has a gate to which the control bias VBIAS is applied. A region on a substrate on which the PMOS transistors MP2 and MP3 are mounted may be coupled to the boosted voltage source VPP.

While the present invention has been shown and described in connection with exemplary embodiments thereof, it will be apparent to those skilled in the art that various modifications can be made without departing from the spirit and scope of the invention as defined by the appended claims.

What is claimed is:

1. A multilevel nonvolatile memory device, comprising:
    at least one multilevel memory cell having a level of resistance that varies according to data stored therein; and
    a read circuit which first reads first bit data from the multilevel memory cell by providing a first read bias to the multilevel memory cell, and which secondarily reads second bit data from the multilevel memory cell by providing a second read bias to the multilevel memory cell, the second read bias varying according to a result of the first reading,
    wherein when the first bit data has a first level, a level of the second read bias is higher than a level of the first read bias, and when the first bit data has a second level, the level of the second read bias is lower than the level of the first read bias.

2. The multilevel nonvolatile memory device of claim 1, wherein the read circuit comprises a plurality of read-bias providing units coupled to a plurality of driving biases having different levels, and wherein one of the read-bias providing units is enabled according to the result of the first reading.

3. The multilevel nonvolatile memory device of claim 1, wherein the read circuit comprises:
    a driving-bias generation unit which generates a plurality of driving biases;
    a switching unit which selects one of the driving biases according to the result of the first reading and provides the selected driving bias as a control bias; and
    a read-bias providing unit which provides the second read bias using the control bias.

4. The multilevel nonvolatile memory device of claim 1, wherein the read circuit provides the first and second read biases to the multilevel memory cell through a bitline coupled to the multilevel memory cell.

5. The multilevel nonvolatile memory device of claim 4, wherein the read circuit comprises:
    a sensing node which is coupled to the bit line and receives the first and second read biases; and
    a sensing unit which is coupled to the sensing node and compares a level of the sensing node with a level of a reference bias, and outputs a result of the comparison.

6. The multilevel nonvolatile memory device of claim 5, wherein the level of the reference bias does not change regardless of whether the levels of the first and second read biases change.

7. The multilevel nonvolatile memory device of claim 5, wherein the read circuit further comprises:
    a plurality of read-bias providing units which are coupled to the sensing node and receive a plurality of driving biases having different levels; and
    a read-biasing selector which is coupled to the sensing unit and provides a biasing signal that enables one of the read-bias providing units in response to the result of the comparison performed by the sensing unit.

8. The multilevel nonvolatile memory device of claim 1, wherein the multilevel memory cell comprises a phase-change random access memory (PRAM) cell.

9. A multilevel nonvolatile memory device, comprising:
    at least one multilevel memory cell having a level of resistance that varies according to data stored therein; and
    a read circuit which first reads first bit data from the multilevel memory cell by providing a first read bias to the multilevel memory cell, and which secondarily reads second bit data from the multilevel memory cell by providing a second read bias to the multilevel memory cell, the second read bias varying according to a result of the first reading, the read circuit providing the first and second read biases to the multilevel memory cell through a bitline coupled to the multilevel memory cell,
    wherein the read circuit comprises:
    a sensing node which is coupled to the bit line and receives the first and second read biases;
    a sensing unit which is coupled to the sensing node and compares a level of the sensing node with a level of a reference bias, and outputs a result of the comparison;
    a switching unit which selects one of a plurality of driving biases according to the result of the first reading and provides the selected driving bias as a control bias;
    a read-bias providing unit which is coupled to the sensing node and provides the second read bias using the control bias; and
    a control-biasing selector which is coupled to the sensing unit and provides a biasing signal to the switching unit in response to the result of the comparison performed by the sensing unit.

10. A multilevel nonvolatile memory device, comprising:
    at least one multilevel memory cell coupled to a wordline and a bitline, the at least one multilevel memory cell having a level of resistance that varies according to a value of data stored therein;
    a sensing node coupled to the bitline;
    a switch which selects one of a plurality of driving biases having different levels and sequentially provides first and second control biases;
    a read-bias providing unit, coupled to the sensing node, which provides a first read bias based on the first control bias and provides a second read bias based on the second control bias; and
    a sensor, coupled to the sensing node, which compares a level of the sensing node with a level of a reference bias and outputs first comparison result data in response to the first read bias and outputs second comparison result data in response to the second read bias, wherein a level of the second control bias is determined according to the first comparison result data, wherein when the first comparison result data indicates that the level of the sensing node is lower than the level of the reference bias, the level of the second control bias is lower than a level of the first control bias.

11. The multilevel nonvolatile memory device of claim 10, wherein when the first comparison result data indicates that the level of the sensing node is higher than the level of the reference bias, the level of the second control bias is higher than a level of the first control bias.

12. The multilevel nonvolatile memory device of claim 10, wherein the level of the reference bias does not change regardless of whether a level of the first read bias and the level of the second read bias change.

13. The multilevel nonvolatile memory device of claim 10, further comprising a latch which is coupled to the sensor and stores the first comparison result data and the second comparison result data.

* * * * *